US012610866B2

(12) United States Patent
Chen et al.

(10) Patent No.: US 12,610,866 B2
(45) Date of Patent: Apr. 21, 2026

(54) SEMICONDUCTOR DEVICE AND METHOD OF MANUFACTURING THE SAME

(71) Applicant: National Yang Ming Chiao Tung University, Hsinchu City (TW)

(72) Inventors: Kuan-Neng Chen, Hsinchu City (TW); Yi-Chieh Tsai, Taoyuan City (TW); Demin Liu, Hsinchu City (TW); Han-Wen Hu, Hsinchu County (TW)

(73) Assignee: National Yang Ming Chiao Tung University, Hsinchu City (TW)

( * ) Notice: Subject to any disclaimer, the term of this patent is extended or adjusted under 35 U.S.C. 154(b) by 578 days.

(21) Appl. No.: 18/063,065

(22) Filed: Dec. 7, 2022

(65) Prior Publication Data

US 2024/0030184 A1 Jan. 25, 2024

(30) Foreign Application Priority Data

Jul. 25, 2022 (TW) .................................. 111127804

(51) Int. Cl.
*H01L 25/065* (2023.01)
*H10W 90/00* (2026.01)
*H10W 90/20* (2026.01)

(52) U.S. Cl.
CPC .......... *H10W 90/00* (2026.01); *H10W 90/291* (2026.01); *H10W 90/297* (2026.01); *H10W 90/722* (2026.01); *H10W 90/724* (2026.01)

(58) Field of Classification Search
None
See application file for complete search history.

(56) References Cited

U.S. PATENT DOCUMENTS

| | | | | |
|---|---|---|---|---|
| 8,653,641 B2 * | 2/2014 | Chen | ...................... | H01L 23/60 |
| | | | | 257/686 |
| 2012/0153437 A1 * | 6/2012 | Chen | .................... | H10D 89/931 |
| | | | | 257/E29.019 |
| 2012/0182650 A1 * | 7/2012 | Chi | ......................... | H01L 23/60 |
| | | | | 438/107 |
| 2013/0169355 A1 * | 7/2013 | Chen | .................. | H01L 25/0657 |
| | | | | 327/564 |
| 2016/0322345 A1 | 11/2016 | Lee et al. | | |
| 2018/0277633 A1 | 9/2018 | Yoshioka | | |

(Continued)

FOREIGN PATENT DOCUMENTS

| | | |
|---|---|---|
| TW | 201413909 A | 4/2014 |
| TW | 201740361 A | 11/2017 |
| TW | 201913888 A | 4/2019 |

(Continued)

OTHER PUBLICATIONS

Mirko Scholz et al., "ESD protection design in active-lite interposer for 2.5 and 3D systems-in-package", 2015 37th Electrical Overstress/Electrostatic Discharge Symposium (EOS/ESD), Sep. 2015.

*Primary Examiner* — Long Pham
(74) *Attorney, Agent, or Firm* — CKC & Partners Co., LLC

(57) ABSTRACT

An embodiment of the present application provides a semiconductor device, including a substrate, a chip, a latch-up protection circuit, and a redistribution layer. The chip is on the substrate. The latch-up protection circuit is separated from the chip in a direction. The redistribution layer transmits a signal between the latch-up protection circuit and the chip.

14 Claims, 12 Drawing Sheets

(56)                    References Cited

U.S. PATENT DOCUMENTS

| | | |
|---|---|---|
| 2018/0358352 A1 | 12/2018 | Voldman |
| 2020/0058787 A1 | 2/2020 | Nguyen et al. |

FOREIGN PATENT DOCUMENTS

| | | |
|---|---|---|
| TW | 201921629 A | 6/2019 |
| TW | 202114137 A | 4/2021 |
| TW | 202225804 A | 7/2022 |

* cited by examiner

800

130

721

111

110 chip hard block

140

Y   X

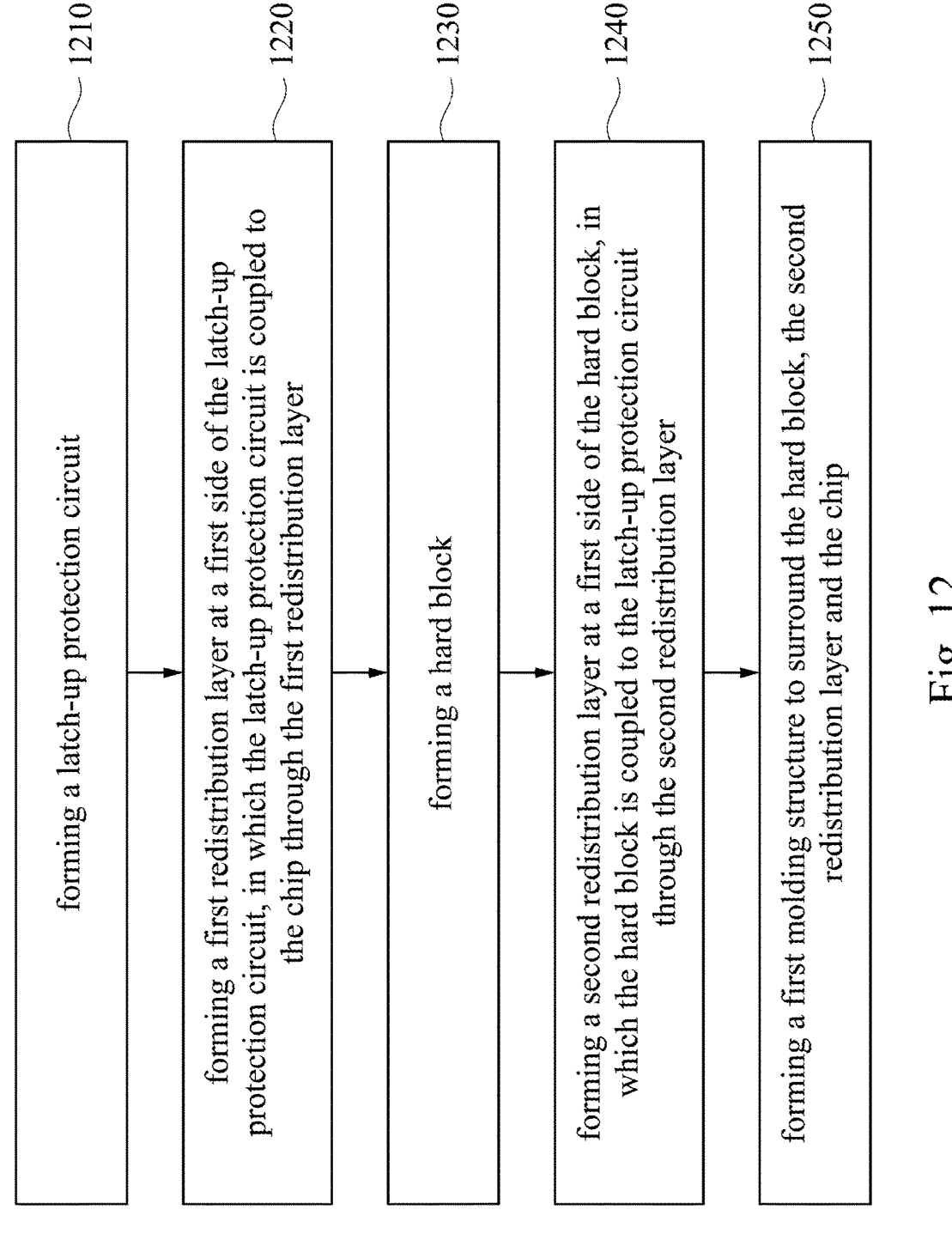

1200

1210  forming a latch-up protection circuit 1220  forming a first redistribution layer at a first side of the latch-up protection circuit, in which the latch-up protection circuit is coupled to the chip through the first redistribution layer 1230  forming a hard block 1240  forming a second redistribution layer at a first side of the hard block, in which the hard block is coupled to the latch-up protection circuit through the second redistribution layer 1250  forming a first molding structure to surround the hard block, the second redistribution layer and the chip

Fig. 12

SEMICONDUCTOR DEVICE AND METHOD OF MANUFACTURING THE SAME

RELATED APPLICATIONS

This application claims priority to Taiwanese Application Serial Number 111127804, filed Jul. 25, 2022, which is herein incorporated by reference.

BACKGROUND

Description of Related Art

In a complementary metal-oxide-semiconductor device, a structure with a positive feedback loop may be formed by parasitic elements like parasitic silicon controlled rectifiers. Once the positive feedback loop is triggered, a latch-up occurs. The large amount of the current caused by the latch-up could damage the semiconductor device. With the increasing density of integration and packaging of a semiconductor device, possibility of a latch-up in the semiconductor device increases. For an advanced manufacturing process, either modification in layout design or improvement of process technology to prevent a latch-up would significantly raise the reliability of a semiconductor device.

SUMMARY

One aspect of the present disclosure is to provide a semiconductor device including a substrate, a first chip, a latch-up protection circuit and a first redistribution layer. The first chip is disposed on the substrate. The latch-up protection circuit is separated from the first chip in a first direction. The first redistribution layer transmits a first signal between the latch-up protection circuit and the first chip.

Another aspect of the present disclosure is to provide a semiconductor device including a substrate, a first chip and a latch-up protection circuit. The first chip and a second chip are both disposed on the substrate. The latch-up protection circuit has a first terminal and a second terminal. The first terminal is coupled to the first chip and the substrate. The second terminal is coupled to the first chip and the second chip.

Another aspect of the present disclosure is to provide a method of manufacturing a semiconductor device including: forming a latch-up protection circuit; forming a first redistribution layer at a first side of the latch-up protection circuit, wherein the latch-up protection circuit is coupled a chip through the first redistribution layer; forming a hard block; forming a second redistribution layer at a first side of the hard block, wherein the hard block is coupled to the latch-up protection circuit through the second redistribution layer; and forming a first molding structure to surround the hard block, the second redistribution layer and the chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 is a flow chart of a method of manufacturing a semiconductor device, in accordance with some embodiments.

DETAILED DESCRIPTION

Figure 1:
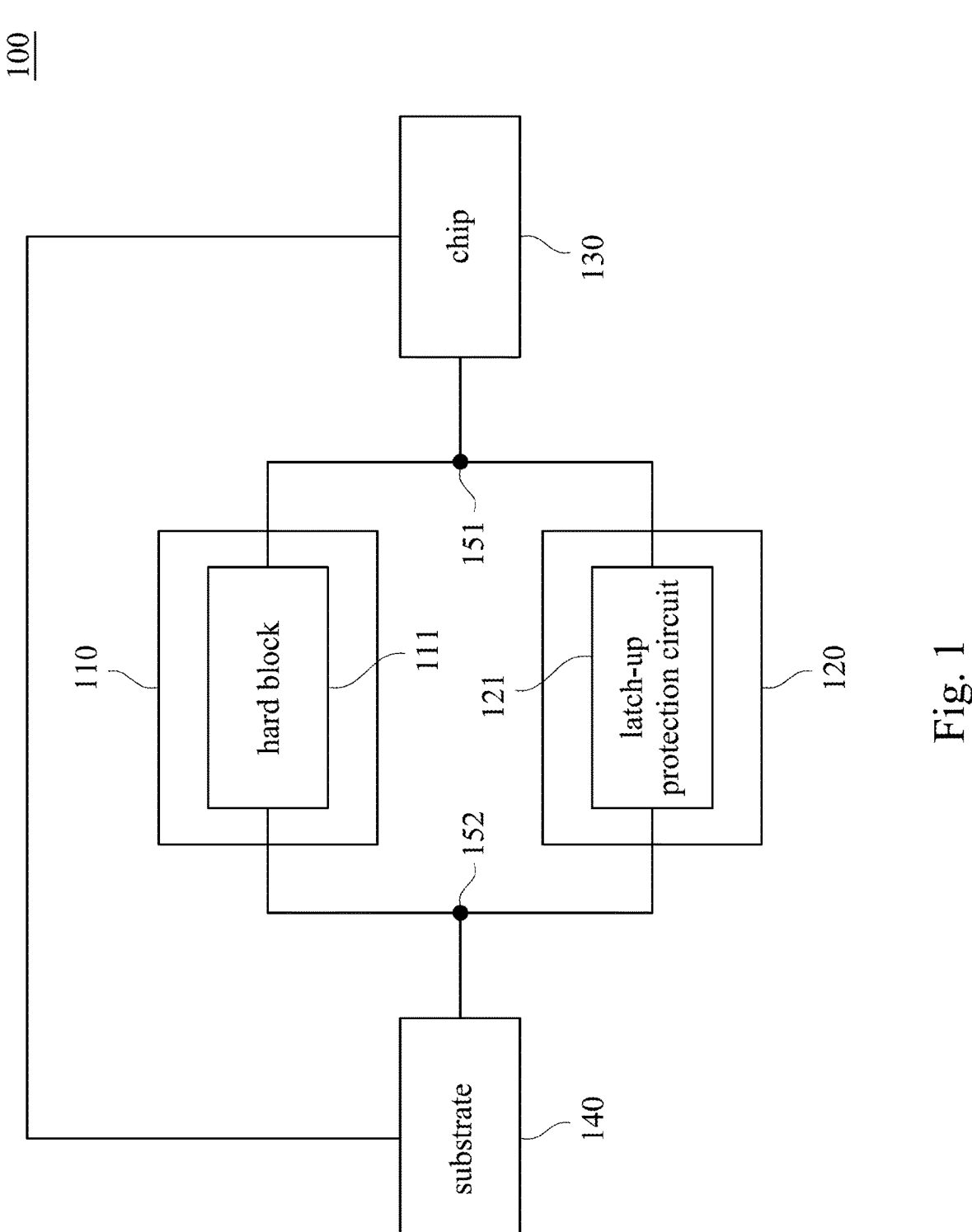
FIG. 1 is a block diagram of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

FIG. 1 is a block diagram of a semiconductor device 100, according to some embodiments. In the embodiment depicted in FIG. 1, the semiconductor device 100 includes chips 110-130 and a substrate 140, in which the chip 110 includes a hard block 111 and the chip 120 includes latch-up protection circuit 121. The chip 130 is coupled to a terminal 151 coupled between the hard block 111 and the latch-up protection circuit 121. The substrate 140 is coupled to a terminal 152 coupled between the hard block 111 and the latch-up protection circuit 121. In some embodiments, the chip 130 is coupled to the substrate 140.

In some embodiments, the hard block 111 is configured to receive a signal input through terminals 151-152 or output a signal through terminals 151-152. In some embodiments, the hard block 111 includes a logic circuit configured to process the signal transmitted through terminals 151-152 or operate in response to the signal transmitted through terminals 151-152. In some embodiments, the hard block 111 includes a circuit of a central processing unit (CPU), a circuit of a graphics processing unit (GPU), combinations thereof, or other suitable circuits for processing.

In some embodiments, the latch-up protection circuit included in the chip 120 is configured as a protection circuit of the hard block 111. For example, a parasitic structure included in the path from the hard block 111 to the substrate 140 and/or another chip (e.g., the chip 130) has a latch-up (e.g., a parasitic structure including parasitic silicon controlled rectifier (SCR) conducts and forms a undesired low impedance path. Therefore, under some circumstances (e.g., an electrostatic discharge event and the like), an instantaneously large current flowing through the low impedance path to the hard block 111 causes irreparable damage to the hard block 111. In various embodiments of the present disclosure, the latch-up protection circuit is configured to prevent the latch-up described above from causing damage to the hard block 111.

In some embodiments, the chip 110 is a high-end chip costing more than the chip 120 to manufacture. For example, in some embodiments, the chip 110 is manufactured by process of technology node smaller than 18 nm while the chip 120 is manufactured by process of technology node larger than 150 nm.

In some embodiments, the chip 130 is configured to receive a signal input from hard block 111 through terminal 151, or transmit a signal to the hard block 111 through terminal 151. In other embodiments, the chip 130 further receives a signal transmitted from the hard block 111 through the substrate 140. For example, the signal is transmitted first through the terminal 152, then the substrate 140 to the chip 130. Similarly, the chip 130 transmits a signal to hard block 111 through the substrate 140. For example, the signal is transmitted first through the substrate 140, then the terminal 152 to the hard block 111. In some embodiments, the chip 130 includes a functional chip like a power management chip. In some embodiments, the chip 130 is manufactured by a low-end manufacturing process (larger than 18 nm).

In some embodiments, the substrate 140 is configured to receive a signal input from the hard block 111 through the terminal 152, or transmit a signal to the hard block through the terminal 152. In some embodiments, the substrate 140 includes conductive layers configured to transmit a signal. According to some embodiments, the substrate 140 may be a printed circuit board (PCB), an Ajinomoto build-up film (ABF), glass, a flexible printed circuit (FPC) board, a carrier or another suitable substrate.

Figure 2:
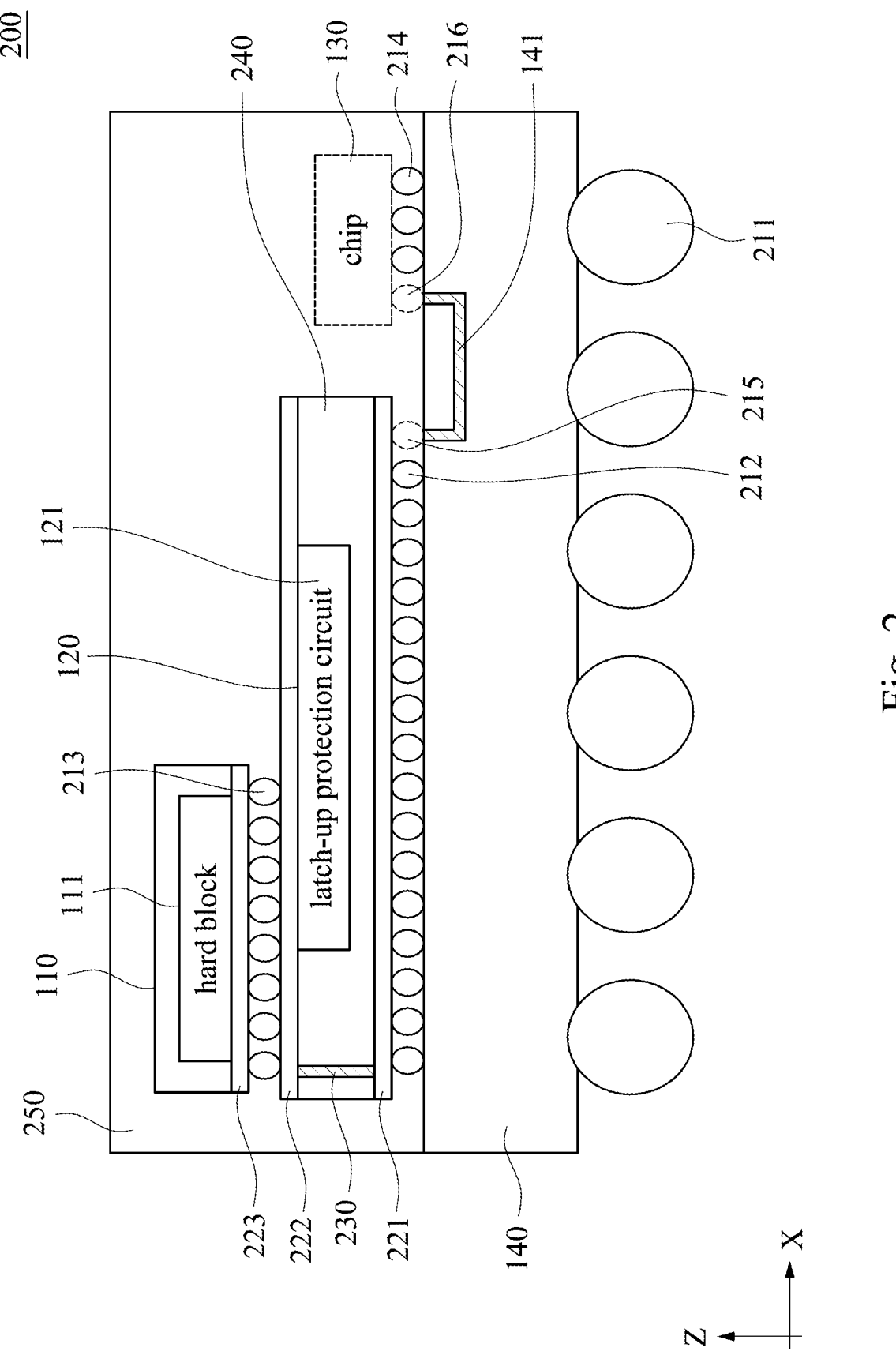
FIG. 2 is a cross-sectional view of a semiconductor device, in accordance with some embodiments.

Reference is now made to FIG. 2. FIG. 2 is a cross-sectional view of a semiconductor device 200 configured according to the semiconductor device 100 in FIG. 1, according to some embodiments. With respect to FIG. 1, like elements in FIG. 2 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 2.

As depicted in FIG. 2, in the semiconductor device 200, the hard block and the latch-up protection circuit 121 are disposed in different chips 110 and 120, in which the chips 110, 120 is on the substrate and separated from each other along a z direction (vertical direction). In some embodiments, the chip 110 is packaged above the chip 120. Besides, the chip 130 is disposed on the substrate 140 and the surface the chip 120 disposed on.

For illustration, the semiconductor device 200 further includes bumps 211-214, redistribution layers (RDLs) 221-223, vias 230, an interposer 240 and molding structure 250. In some embodiments, the chip 120 includes the interposer 240 and the molding structure 250 surrounds the elements above the substrate 140 in the semiconductor devices 200, as depicted in FIG. 2.

In some embodiments, bumps 211-214 may be structures providing electrical connections like solder balls, micro bumps, pillar bumps and the like. In some embodiments, each one of redistribution layers 221-223 includes at least one metal interconnection layer. For example, redistribution layers 221-223 have metal interconnection layers formed by conductive materials like copper and separated by low-k dielectric materials like polyimide (PI). In some embodiments, the via 230 includes multiple vias. In some embodiments, the interposer 240 is a silicon interposer. In some embodiments, the molding structure 250 is formed by molding materials including, for example, epoxy resin.

In some embodiments, the substrate 140 has multiple conductive structures formed by conductors like metal lines, vias, etc. and separated from each other by low-k dielectric materials (like glass fiber and epoxy resin) in the substrate 140. In some embodiments, the bumps 211 and 212 are coupled together by the conductive structures in the substrate 140.

In the embodiments depicted in FIG. 2, the substrate 140 includes the conductive structure 141 in the substrate 140. The conductive structure 141 is coupled between a bump 215 included in the bumps 212 and a bump 216 included in the bumps 214. According to descriptions above, in some embodiments, the bumps 214 are disposed and coupled between the chip 130 and the substrate 140, and configured to transmit a signal between the chips 120, 130 and the substrate 140.

According to the embodiment depicted in FIG. 2, the interposer 240 includes the via 230 and the latch-up protection circuit 121, disposed on a surface on top of the substrate 140. The redistribution layer 221 is at a lower side of the interposer 240, and the redistribution layer 222 is at a upper side opposite to the lower side of the interposer 240. The bumps 212 is disposed between the redistribution layer 221 and the substrate 140.

The chip 110 including the hard block 111 is on a surface on top of the interposer 240. The redistribution layer 223 is disposed at a lower side of the hard block 111. The bumps 213 are disposed between the redistribution layers 222 and 223. The vias 230 couple the redistribution layer 221 to the redistribution layer 222. The redistribution layer 221 is coupled to the bumps 212 and coupled to the substrate 140 through the bumps 212. The redistribution layer 222 is coupled to the latch-up protection circuit 121 and the bumps 213, and coupled to the redistribution layer 223 through the bumps 213. The redistribution layer 223 is coupled to the hard block 111 and the bumps 213.

In some embodiments, the redistribution layers 221-223 are configured to transmit a signal input from the substrate 140 to the hard block 111, and to transmit a signal output from the hard block 111 to the substrate 140. For example, a signal from the substrate 140 is transmitted sequentially through the bumps 212, the redistribution layer 221, the via 230, the redistribution layer 222, the bumps 213 and the redistribution layer 223 to the hard block 111. Similarly, a signal output from the hard block 111 is transmitted sequentially through the redistribution layer 223, the bumps 213, the redistribution layer 222, the via 230, the redistribution layer 221 and the bumps 212 to the substrate 140.

In some embodiments, the redistribution layers 221-222 are further configured to transmit a signal from the substrate 140 to the latch-up protection circuit 121. For example, a signal from the substrate 140 is transmitted sequentially through the bumps 212, the redistribution layer 221, the via 230 and the redistribution layer to the latch-up protection circuit 121.

In some embodiments, the redistribution layers 222-223 are further configured to transmit a signal from the chip 130 to the hard block 111, and a signal from the hard block 111 to the chip 130. For example, a signal from the chip 130 is transmitted sequentially through the bumps 214, the redistribution layer 222, the bumps 213, the redistribution layer 223 to the hard block 111. Similarly, a signal output from the hard block 111 is transmitted sequentially through the redistribution layer 223, the bumps 213, the redistribution layers 222 and the bumps 214 to the chip 130.

The embodiment depicted in FIG. 2 is not intended to limit the present disclosure. In some embodiments, the chip 130 includes at least one redistribution layer at a lower side of the chip 130 and coupled thereto, configured to input a signal to the chip 130 and output a signal from the chip 130.

Figure 3:
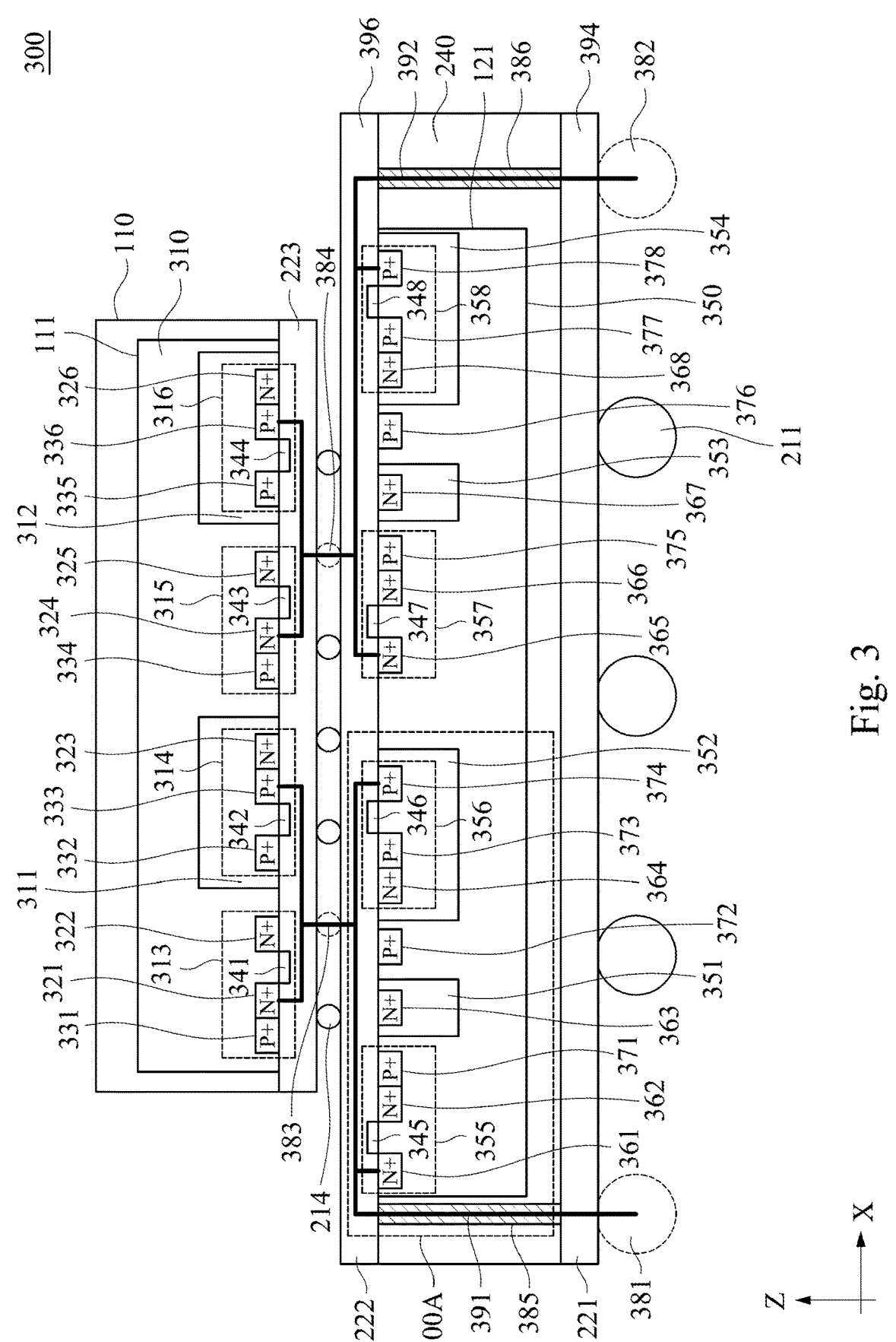
FIG. 3 is a cross-sectional view of a semiconductor device, in accordance with some embodiments.

Reference is now made to FIG. 3. FIG. 3 is a cross-sectional view of a semiconductor device 300 configured according to the semiconductor device 200 in FIG. 2, according to some embodiments. With respect to FIGS. 1-2, like elements in FIG. 3 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 3.

For illustration, the hard block 111 further include a semiconductor substrate 310, wells 311-312 and transistors 313-316 in the semiconductor substrate 310, as depicted in FIG. 3. In some embodiments, the semiconductor substrate 310 is a p-type semiconductor substrate, the wells 311-312 are n-type wells, the transistors 313, 315 are n-type transistors, and transistors 314, 316 are p-type transistors.

The transistor 313 including doped regions 321-322 as source/drain terminals, a doped region 331 as a body and a gate 341 is disposed next to the well 311. The transistor 314 including a doped region 323 as a body, doped regions 332-333 as source/drain terminals, and a gate 342 is disposed in the well 311. The transistor 315 including doped regions 324-325 as source/drain terminals, doped regions 334 as a body and a gate 343 is disposed between the wells 311-312. The transistor 316 including a doped region 326 as a body, doped regions 335-336 as source/drain terminals, and a gate 344 is disposed in the well 312. In some embodiments, the doped regions 321-326 are N+ doped region and the doped regions 331-336 are P+ doped regions.

As depicted in FIG. 3, the latch-up protection circuit 121 includes a semiconductor substrate 350, wells 351-354 and transistors 355-358 on the semiconductor substrate 350. In some embodiments, the semiconductor substrate 350 is a p-type substrate, the wells 351-354 are n-type wells, the transistors 355, 357 are n-type transistors and the transistors 356, 358 are p-type transistors.

The well 351 includes a doped region 363 therein and is disposed at one side of a doped region 372, in which the well 351 and the doped region 372 is separated by a part of the semiconductor substrate 350. The well 352 includes a transistor 356 therein and is disposed at the other side of a doped region 372, opposite to the side the well 351 is disposed at, in which the well 352 and the doped region 372 is separated by a part of the semiconductor substrate 350. The well 353 includes a doped region 367 therein and is disposed at one side of a doped region 376, in which the well 353 and the doped region 376 is separated by a part of the semiconductor substrate 350. The well 354 includes a transistor 358 therein and is disposed at the other side of a doped region 376, opposite to the side the well 353 is disposed at, in which the well 354 and the doped region 376 is separated by a part of the semiconductor substrate 350. In some embodiments, the doped regions 363, 367 are N+ doped regions and doped regions 372, 376 are P+ doped regions.

The transistor 355 including a gate 345, a doped region 371 as a body and doped regions 361-362 as source/drain terminals is disposed at the other side of the well 351, opposite to the side the doped region 372 is disposed at. The transistor 356 including gate 346, a doped region 364 as a body and doped regions 373-374 as source/drain terminals is disposed in the well 352. The transistor 357 including a gate 347, doped regions 365-366 as source/drain terminals and a doped region 375 as a body is disposed at the other side of the well 353, opposite to the side the doped region 376 is disposed at. The transistor 358 including a gate 348, a doped region 368 as a body and doped regions 377-378 as source/drain terminals is disposed in the well 354. In some embodiments, the doped regions 361-368 are N+ doped regions and doped regions 371-378 are P+ doped regions.

The semiconductor device 300 further includes vias 385-386. In some embodiments, the vias 385-386 are configured according to, for example, the via 230 in FIG. 2 and are included in the interposer 240. As shown in the embodiment depicted in FIG. 3, the vias 385-386 are at the opposite sides of the latch-up protection circuit 121.

In some embodiments, as depicted in FIG. 3, the hard block 111 receives a signal from the substrate 140 through a conductive path 391. For example, the conductive path 391 includes a bump 381 included in the bumps 211, the redistribution layer 221, the vias 385, the redistribution layer 222, a bump 383 included in the bumps 214 and the redistribution layer 223. For illustration, the bump 381 is configured to receive a signal from the substrate 140, and transmit the signal to the via 385 through the redistribution layer 221. Then, the via 385 transmits the signal to the bump 383 coupled between the redistribution layers 222-223 through the redistribution layer 222. The signal is subsequently transmitted to at least the doped region 321, 333 of the hard block 111 through the bump 383 and the redistribution layer 223.

In addition, in the embodiment described above, the doped regions 361, 374 in the latch-up protection circuit 121 are coupled to the via 385 through the redistribution layer 222. In other words, the latch-up protection circuit 121 is coupled to the conductive path 391. With the configurations described above, for example, when an electrostatic discharge event occurs, a instantaneously large current entering from the bump 381 will be lead to the latch-up protection circuit 121 first to prevent a latch-up in the hard block 111. As a result, the latch-up protection circuit 121 protects the hard block 111 from damage.

On the other side, the hard block 111 output a signal to the substrate 140 through the conductive path 392 in some embodiments. For example, the conductive path 392 includes the redistribution layer 223, a bump 384 included in the bumps 214, the redistribution layer 222, the via 386, the redistribution layer 221 and a bump 382 included in the bumps 211. For illustration, the redistribution layer 223 is configured to receive a signal from at least the doped regions 324, 336 of the hard block 111. The signal is subsequently transmitted to redistribution layer 222 through the bump 384 coupled between the redistribution layers 222-223. Then, the redistribution layer 222 transmits the signal to the redistribution layer 221 through the via 386. Through the redistribution layer 221, the signal is subsequently transmitted to the bump 382 coupled to the redistribution layer 221 and finally to the substrate 140 through the bump 382.

The cross-sectional view depicted in FIG. 3 is merely an example and is not intended to limit the present disclosure. The signal from the substrate 140 may be input to other elements in the hard block 111.

Figure 4:
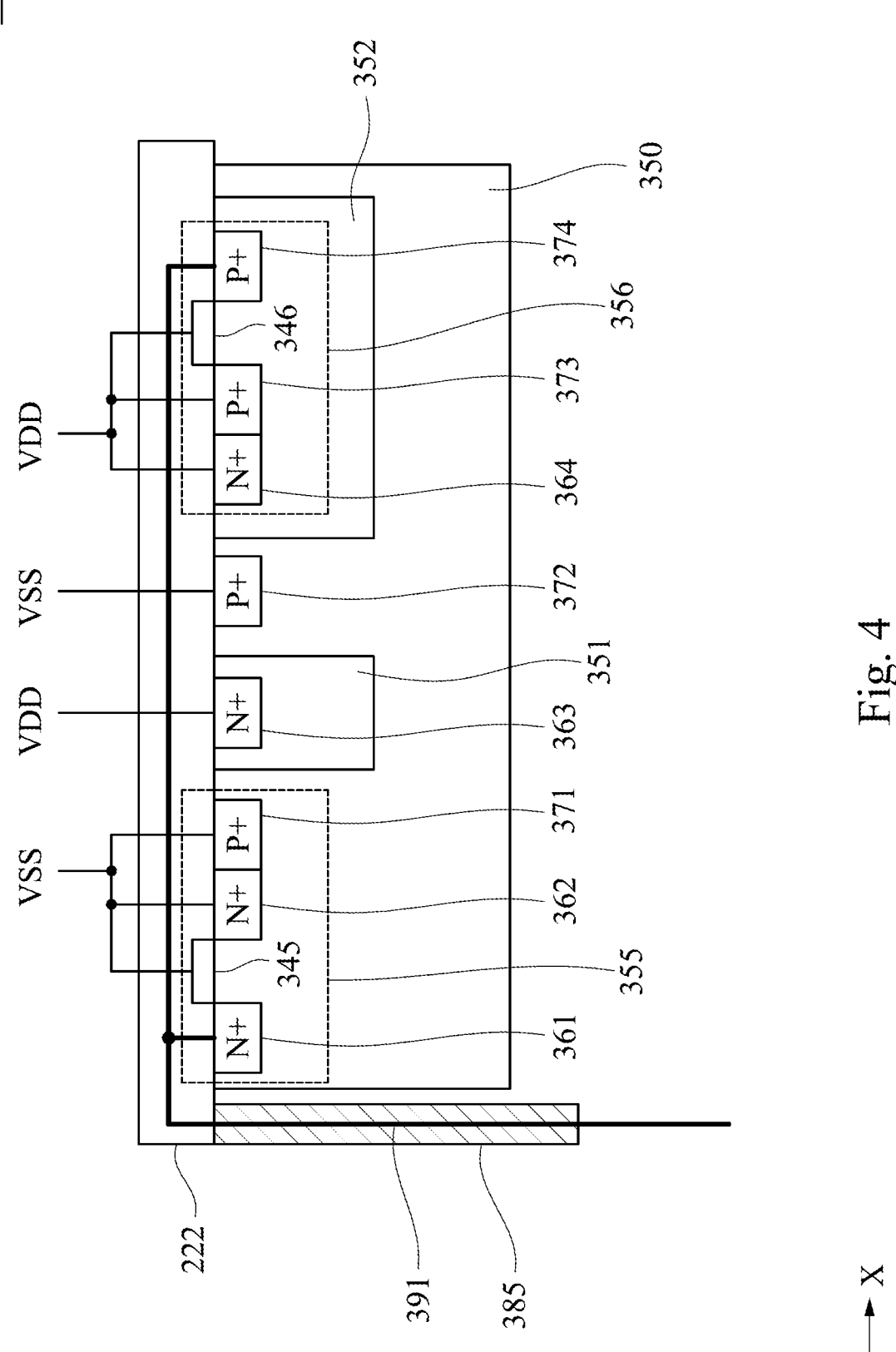
FIG. 4 is a cross-sectional view of a region of the semiconductor device corresponding to FIG. 3, in accordance with some embodiments.

Reference is now made to FIG. 4. FIG. 4 is a cross-sectional view corresponding to the region 300A of the semiconductor device 300 in FIG. 3. With respect to FIGS. 2-3, like elements in FIG. 4 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 4.

In some embodiments, the gate 345, the doped regions 362, 371-372 receive a supply voltage VSS. The gate 346, the doped regions 363-364, 373 receive a supply voltage VDD, in which the level of the supply voltage VDD is higher than the level of the supply voltage VSS.

Figure 5:
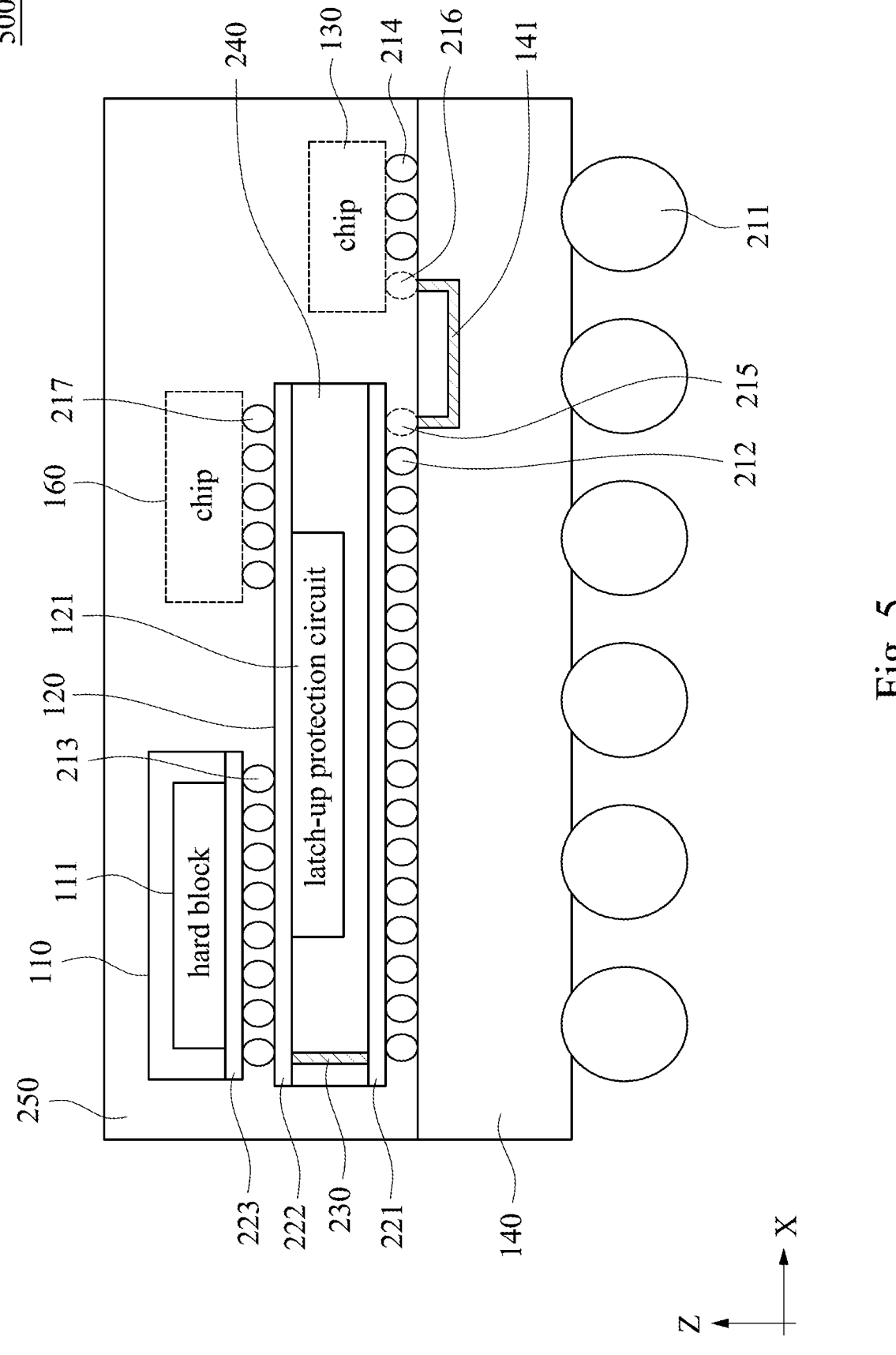
FIG. 5 is a cross-sectional view of a semiconductor device, in accordance with some embodiments.

Reference is now made to FIG. 5. FIG. 5 is a cross-sectional view of the semiconductor device 500 according to some embodiments. With respect to FIG. 2-4, like elements in FIG. 5 are designated with the same reference numbers for ease of understanding. In some embodiments, the semiconductor device 500 is configured according to, for example, the semiconductor device 200 in FIG. 2.

Compare to the semiconductor device 200 in FIG. 2, the semiconductor device 500 in FIG. 5 further includes a chip 160 and bumps 217. The chip 160 is disposed on the interposer 240 and is on the surface where the hard block 111 is disposed on. The bumps 217 is disposed and coupled between the chip 160 and the redistribution layer 222.

In some embodiments, the chip 160 is configured to receive a signal from the hard block 111 or send a signal to the hard block 111. In some embodiments, the chip 160 includes functional chips with higher requirement than the chip 130 for acceleration of the communication between the hard block 111, reduction of the signal interference or combinations thereof. For example, the chip 160 is a high bandwidth memory (HBM) providing data for the hard block 111 and the chip 130 is a power management chip. In some embodiments, the processing speed of the operations between the chip 160 and the hard block 111 is faster than that between the chip 130 and the hard block 111. In some embodiments, the chip 160 is manufactured by a low-end (larger than 18 nm) manufacturing process while the chip 110 is manufactured by a high-end one.

In some embodiments, the redistribution layers 221-222 are further configured to transmit a signal from the substrate 140 to the chip 160 and transmit a signal from the chip 160 to the substrate 140. For example, a signal from the substrate 140 is transmitted sequentially through the bumps 212, the redistribution layer 221, the via 230, the redistribution layer 222 and the bumps 217 to the chip 160. Similarly, a signal output from the chip 160 is transmitted sequentially through the bumps 217, the redistribution layer 222, the via 230, the redistribution layer 221 and the bumps 212 to the substrate 140.

Figure 6:
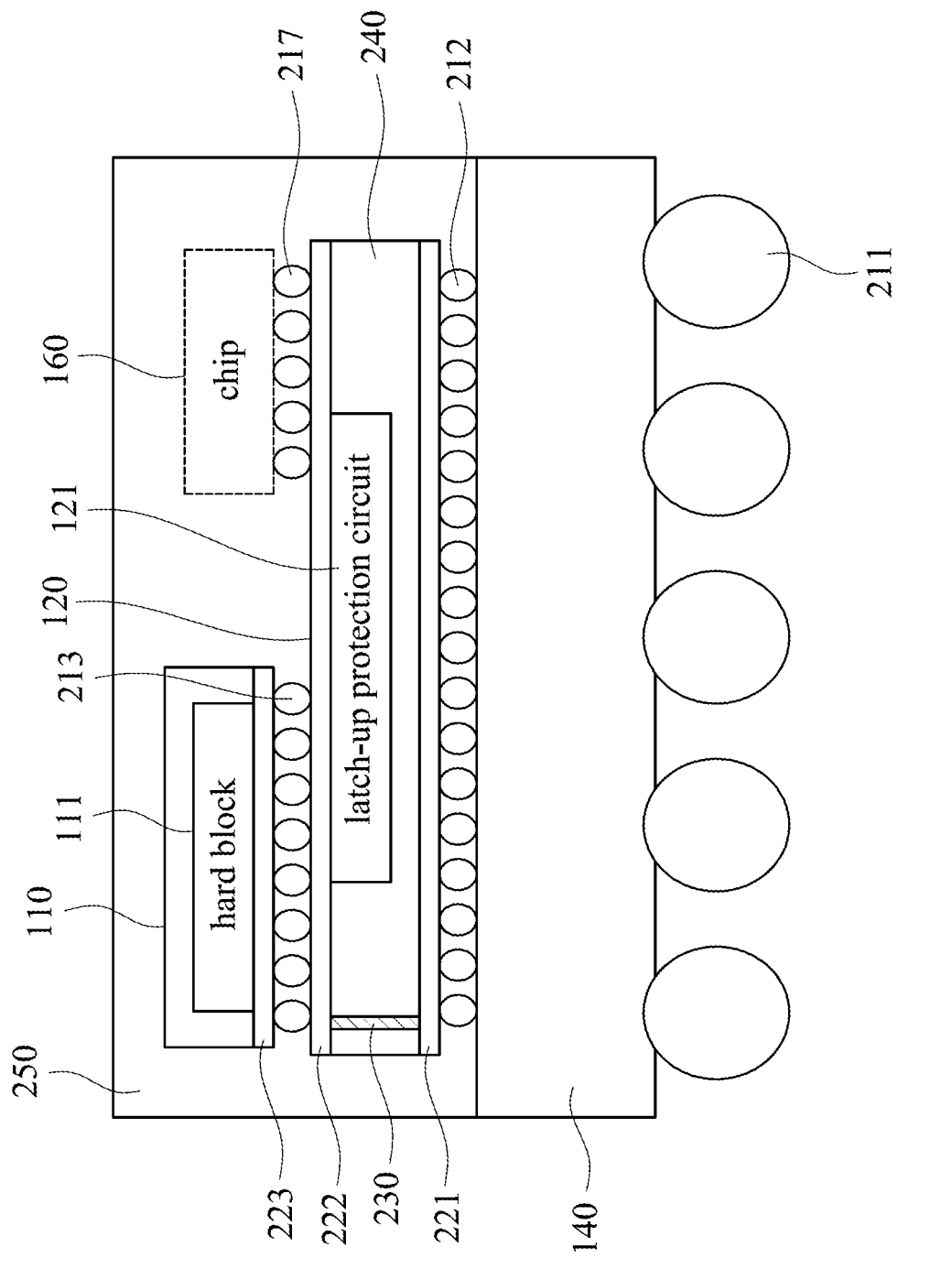
FIG. 6 is a cross-sectional view of a semiconductor device, in accordance with some embodiments.

Reference is now made to FIG. 6. FIG. 6 is a cross-sectional view of the semiconductor device 600 according to some embodiments. With respect to FIGS. 1-5, like elements in FIG. 6 are designated with the same reference numbers for ease of understanding. In some embodiments, the semiconductor device 600 is configured according to, for example, the semiconductor device 500 in FIG. 5.

Compared to the semiconductor device 500 in FIG. 5, the semiconductor device 600 does not have the chip 130, the bumps 214 and the conductive structure 141.

Figure 7:
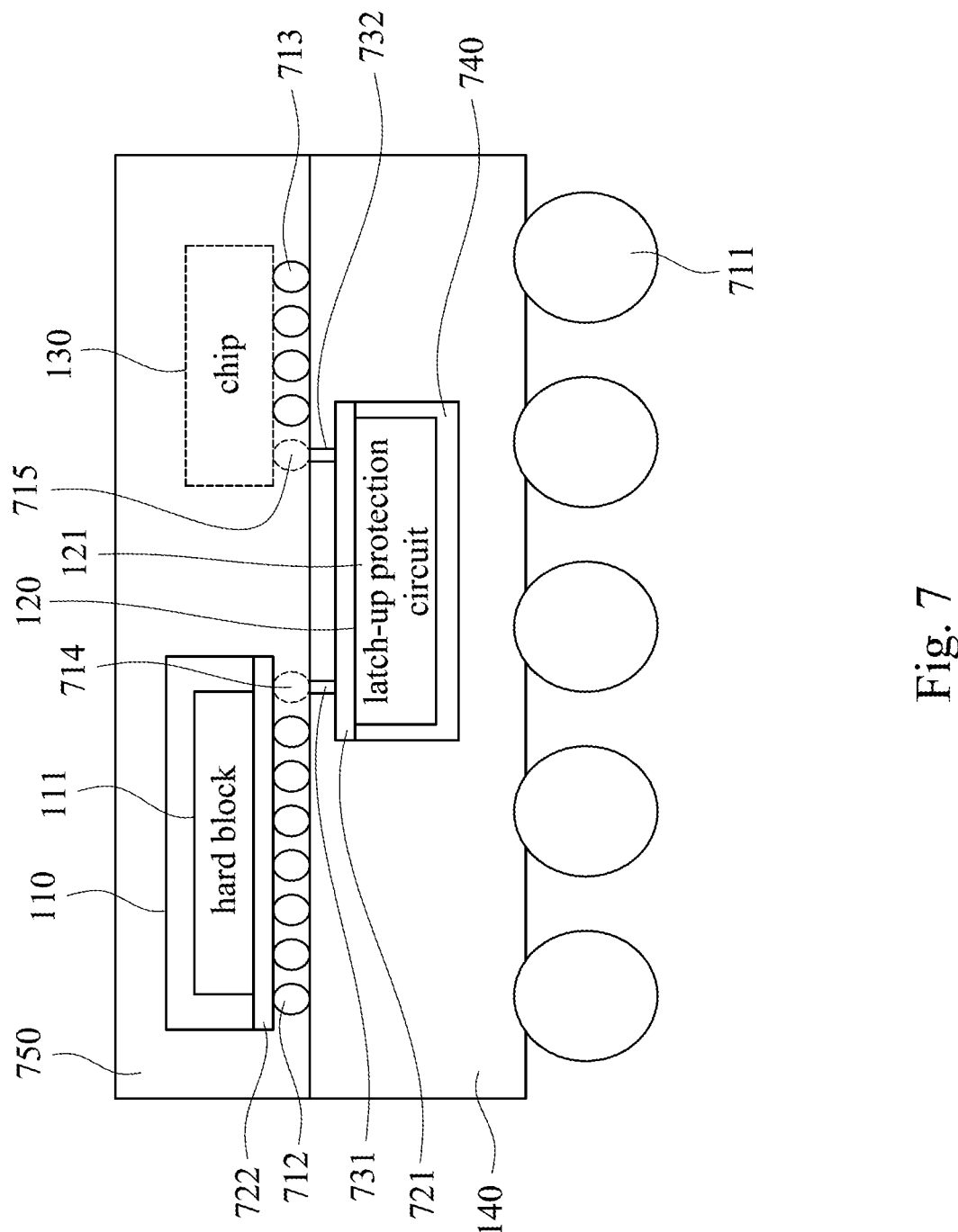
FIG. 7 is a cross-sectional view of a semiconductor device, in accordance with some embodiments.

Reference is now made to FIG. 7. FIG. 7 is a cross-sectional view of the semiconductor device 700 according to some embodiments. With respect to FIGS. 1-6, like elements in FIG. 7 are designated with the same reference numbers for ease of understanding. In some embodiments, the semiconductor device 700 is configured according to, for example, the semiconductor device 200 in FIG. 2.

As depicted in FIG. 7, in the semiconductor device 700, the hard block 111 and the latch-up protection circuit 121 is disposed in different chips 110 and 120, in which the chip 110, 120 are on the substrate 140 and separated from each other along a x direction (horizontal direction).

For illustration, the semiconductor device 700 further include bumps 711-713, redistribution layers 721-722 and molding structure 750. In some embodiments, the bumps 711-713 are configured according to, for example, the bumps 211-213 in FIG. 2. The redistribution layers 721-722 are configured according to, for example, the redistribution layers 221-223 in FIG. 2. The molding structure 750 is configured according to, for example, the molding structure 250 in FIG. 2. In some embodiments, the molding structure 750 surrounds elements of the semiconductor device 700 above the substrate 140 as depicted in FIG. 7.

In some embodiments, the bumps 711 are coupled to the bumps 712-713 and the redistribution layer 721 through conductive structures in the substrate 140.

In the embodiment depicted in FIG. 7, the substrate 140 includes vias 731-732. The via 731 is in the substrate 140, disposed and coupled between the redistribution layer 721 and a bump 714 included in the bumps 712. The via 731 is configured to transmit a signal between the redistribution layer 721 and the bump 714. The via 732 is in the substrate 140, disposed and coupled between the redistribution layer 721 and a bump 715 included in the bumps 713. The via 732 is configured to transmit a signal between the redistribution layer 721 and the bump 715.

According to the embodiment depicted in FIG. 7, the chip 110 including the hard block 111 and the chip 130 are disposed on a surface on top of the substrate 140. In some embodiments, the chip 120 includes a interposer 740 and is disposed in the substrate 140. The interposer 740 includes the latch-up protection circuit 121. According to some embodiments, the interposer 740 mat be a interposer of a embedded multi-die interconnect bridge (EMIB). In some embodiments, the interposer 740 may include silicon, glass or other suitable materials.

The redistribution layer 721 is in the substrate 140, disposed at the upper side of the latch-up protection circuit 121, and coupled between the latch-up protection circuit 121 and the substrate 140. The redistribution layer 722 is disposed at the lower side of the hard block 111, coupled between the hard block 111 and the bumps 712, and coupled to the substrate 140 through the bumps 712.

In some embodiments, the redistribution layer 722 is configured to transmit a signal from the substrate 140 to the hard block 111, and a signal from the hard block 111 to the substrate 140. For example, a signal from the substrate 140 is transmitted sequentially through the bumps 712, the redistribution layer 722 to the hard block 111. Similarly, a signal output from the hard block 111 is transmitted sequentially through 722, the bumps 712 to the substrate 140.

In other embodiments, the redistribution layer 721 is configured to transmit a signal from the substrate 140 to the hard block 111, and a signal from the hard block 111 to the substrate 140. For example, a signal from the substrate 140 is transmitted sequentially through the redistribution layer 721, the via 731, the bump 714 and the redistribution layer 722 to the hard block 111. Similarly, a signal from the hard block is transmitted sequentially through the redistribution layer 722, the bumps 714, the via 731, the redistribution layer 721 to the substrate 140.

In some embodiments, the redistribution layers 721-722 are further configured to transmit a signal from the chip 130 to the hard block 111, and a signal from the hard block 111 to the chip 130. For example, a signal from 130 is transmitted sequentially through the bump 715, the via 732, the redistribution layer 721, the via 731, the bump 714 and the redistribution layer to the hard block 111. Similarly, a signal output from the hard block 111 is transmitted sequentially through the redistribution layer 722, the bump 714, the via 731, the redistribution layer 721, via 732 and the bump 715 to the chip 130.

Figure 8:
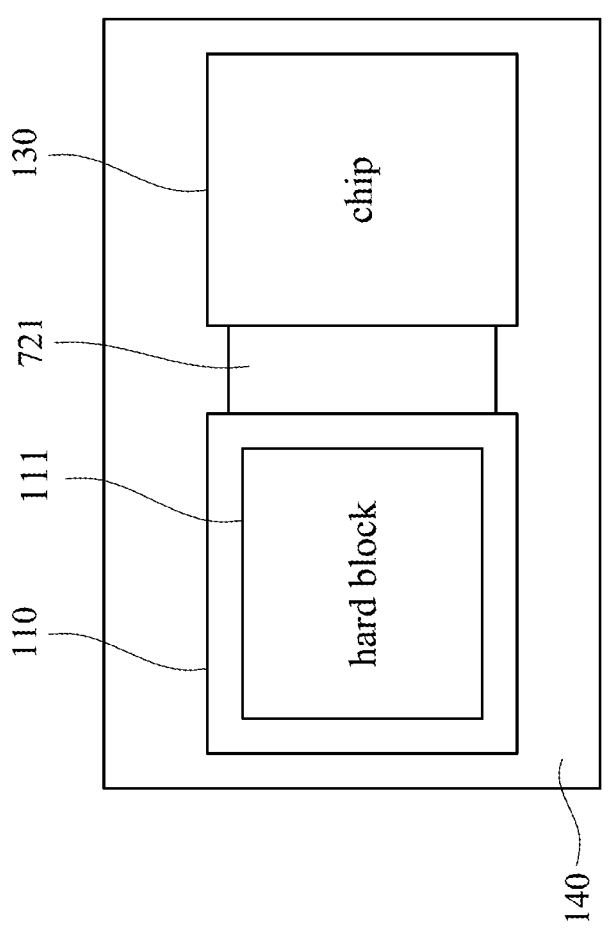
FIG. 8 is a top view of the semiconductor device corresponding to FIG. 7, in accordance with some embodiments.
Figure 8:
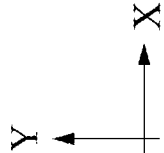

Reference is now made to FIG. 8. FIG. 8 is a top view corresponding to the semiconductor device 700 in FIG. 7 according to some embodiments.

As depicted in FIG. 8, in a top view, the chip 110 including the hard block 111 is separated from the chip 130, and the chips 110, 130 overlap the redistribution layer 721 respectively.

Figure 9:
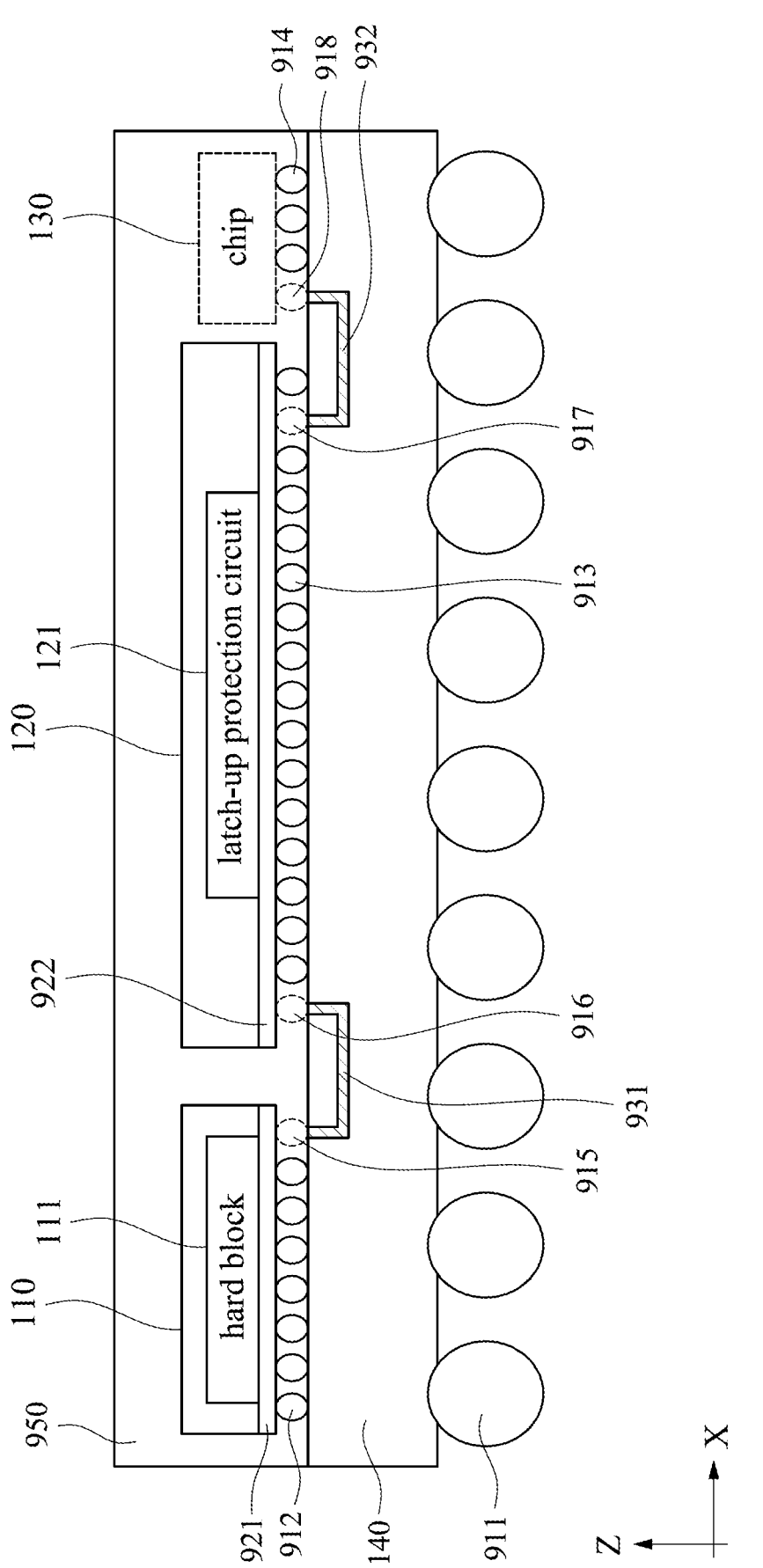
FIG. 9 is a cross-sectional view of a semiconductor device, in accordance with some embodiments.

Reference is now made to FIG. 9. FIG. 9 is a cross-sectional view of the semiconductor device 900 according to some embodiments. With respect to FIGS. 1-8, like elements in FIG. 9 are designated with the same reference numbers for ease of understanding. In some embodiments, the semiconductor device 900 is configured according to, for example, the semiconductor device 200 in FIG. 2.

As depicted in FIG. 9, in the semiconductor device 900, the hard block 111 and the latch-up protection circuit 121 are disposed in different chips 110 and 120, in which the chips 110, 120, 130 are disposed on the substrate 140 and separated from each other along the x direction (horizontal direction). The chips 110-130 are on the same surface.

For illustration, the semiconductor device 900 further includes bumps 911-914, redistribution layers 921-922 and a molding structure 950. In some embodiments, the bumps 911-914 are configured according to, for example, the bumps 211-213 in FIG. 2. The redistribution layers 921-922 are configured according to, for example, the redistribution layers 221-223 in FIG. 2. The molding structure 950 is configured according to, for example, the molding structure 250 in FIG. 2. In some embodiments, the molding structure 950 surrounds elements above the substrate 140 in the semiconductor device 900, as depicted in FIG. 9.

In some embodiments, the bumps 911 are coupled to the bumps 912-914 through conductive structures in the substrate 140.

In the embodiment depicted in FIG. 9, the substrate 140 includes conductive structures 931-931 in the substrate 140. The conductive structure 931 is coupled between a bump 915 included in the bumps 912 and a bump 916 included in the bumps 913. The conductive structure 931 is configured to transmit a signal between the bump 915 and the bump 916. Similarly, the conductive structure 932 is coupled between a bump 917 included in the bumps 913 and a bump 918 included in the bumps 914. The conductive structure 932 is configured to transmit a signal between the bump 917 and the bump 918.

The chip 110 including the hard block 111 is disposed at an upper side of the redistribution layer 921. The chip 120 including the latch-up protection circuit 121 is disposed at an upper side of the redistribution layer 922. The chip 130 is disposed on the bumps 914. The bumps 914 are disposed and coupled between the chip 130 and the substrate 140.

The redistribution layer 921 is disposed on the bumps 912 and coupled between the hard block 111 and the bumps 912. The redistribution layer 922 is disposed on the bumps 913 and coupled to the hard block 111 and the bumps 912, in which the redistribution layer 921 is separated from the redistribution layer 922 in the x direction. The bumps 912 are disposed and coupled between the substrate 140 and the redistribution layer 921. The bumps 913 are disposed and coupled between the substrate 140 and the redistribution layer 922.

In some embodiments, the redistribution layer 921 is configured to transmit a signal from the substrate 140 to the hard block 111, and a signal from the hard block 111 to the substrate 140. For example, a signal from the substrate 140 is transmitted sequentially through the bumps 912, the redistribution layer 921 to the hard block 111. Similarly, a signal output from the hard block 111 is transmitted sequentially through the redistribution layer 921, the bumps 912 to the substrate 140.

In other embodiments, a signal from the substrate 140 to the hard block 111 is transmitted through a conductive path including, for example, the bumps 913, the redistribution layer 922, the bump 916, the conductive structure 931, the bump 915 and the redistribution layer 921 to the hard block 111. Similarly, a signal output from the hard block 111 to the substrate 140 is also transmitted through the described conductive path to the substrate 140. In some embodiments, the redistribution layers 921-922 are further configured to transmit a signal input to the hard block 111 from the chip 130, and a signal output from the hard block 111 to the chip 130. For example, a signal from the chip 130 is transmitted sequentially through the bump 918, the conductive structure 932, the bump 917, the redistribution layer 922, the bump 916, the conductive structure 931, the bump 915 and the redistribution layer 921 to the hard block 111. Similarly, a signal output from the hard block 111 is transmitted sequentially through the redistribution layer 921, the bump 915, the conductive structure 931, the bump 916, the redistribution layer 922, the bump 917, the conductive structure 932 and the bump 918 to the chip 130.

The embodiment depicted in FIG. 9 is not intended to limit the present disclosure. In some embodiments, the chip 130 includes at least one redistribution layer disposed at a lower side of the chip 130 and coupled thereto. The redistribution layer is configured to input a signal to the chip 130 and output a signal from the chip 130.

Figure 10:
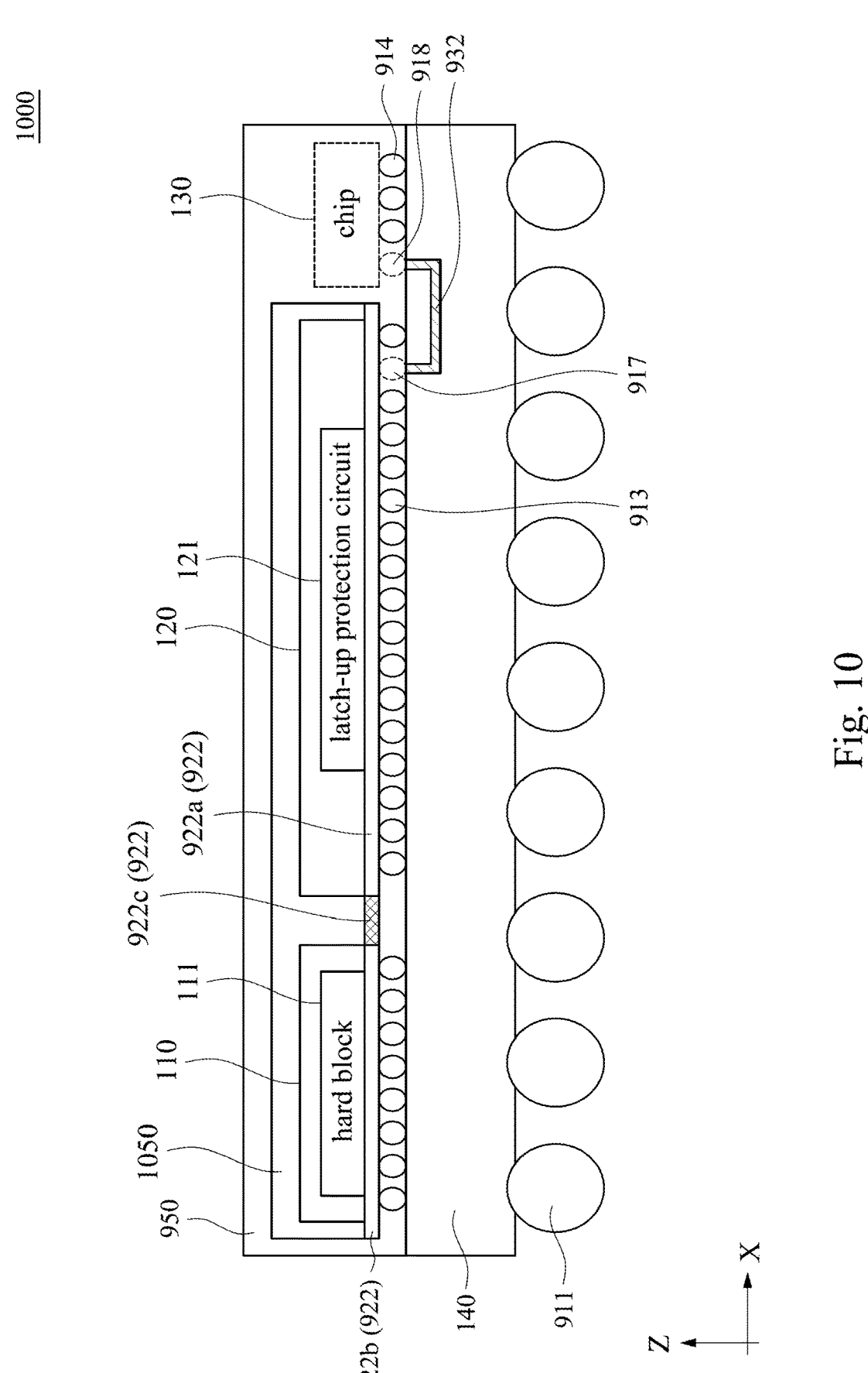
FIG. 10 is a cross-sectional view of a semiconductor device, in accordance with some embodiments.

Reference is now made to FIG. 10. FIG. 10 is a cross-sectional view of a semiconductor device 1000 according to some embodiments. With respect to FIGS. 1-9, like elements in FIG. 10 are designated with the same reference numbers for ease of understanding. In some embodiments, the semiconductor device 1000 is configured according to, for example, the semiconductor device 900 in FIG. 9.

Compared to the semiconductor device 900 in FIG. 9, the semiconductor device in FIG. 10 does not have the redistribution layer 921 and the bumps 912 but further includes a molding structure 1050. The chip 110 including the hard block 111 is disposed on a redistribution layer 922b of the redistribution layer 922 and coupled thereto. The chip 120 including the latch-up protection circuit 121 is disposed on a redistribution layer 922a of the redistribution layer 922 and coupled thereto. In some embodiments, redistribution layers 922a-922c of the redistribution layer 922 are formed simultaneously in the same manufacturing process. In some embodiments, a molding structure 1050 is in the molding structure 950 and surrounds elements above the redistribution layer 922 in the semiconductor device 1000. In some embodiments, the molding structure 1050 is formed by molding materials including, for example, epoxy resin.

In some embodiments, the redistribution layer 922 is further configured to transmit a signal input to the hard block 111 from the chip 130, and a signal output from the hard block 111 to the chip 130. For example, a signal from the chip 130 is transmitted sequentially through the bump 918, the conductive structure 932, the bump 917, the redistribution layer 922 to the hard block 111. Similarly, a signal output from the hard block 111 is transmitted sequentially through the redistribution layer 922, the bump 917, the conductive structure 932 and the bump 918 to the chip 130.

Figure 11:
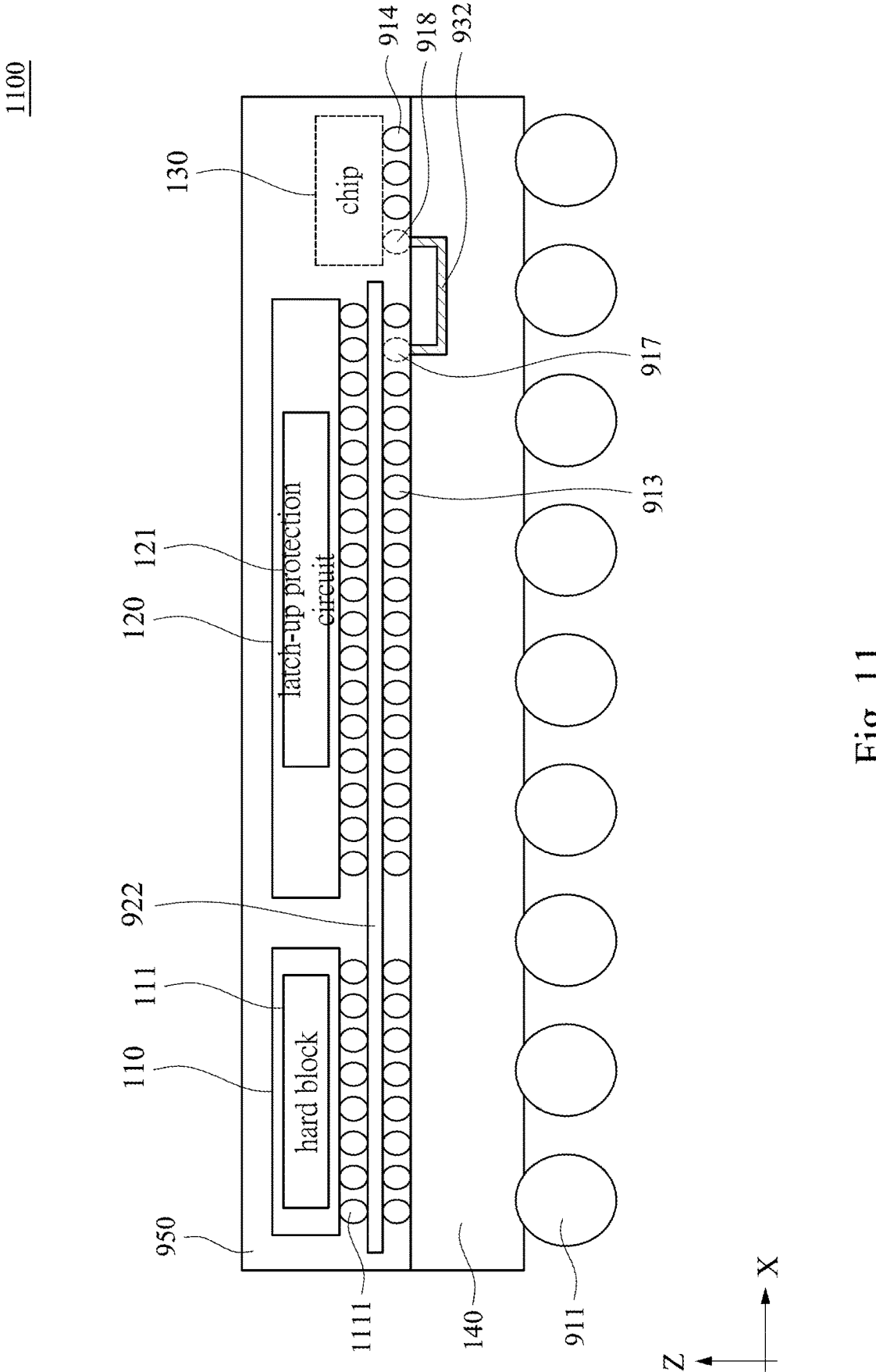
FIG. 11 is a cross-sectional view of a semiconductor device, in accordance with some embodiments.

Reference is now made to FIG. 11. FIG. 11 is a cross-sectional view of a semiconductor device 1100 according to some embodiments. With respect to FIGS. 1-10, like elements in FIG. 11 are designated with the same reference numbers for ease of understanding. In some embodiments, the semiconductor device 1100 is configured according to, for example, the semiconductor device 1000 in FIG. 10.

Compared to the semiconductor device 1000 in FIG. 10, the semiconductor device in FIG. 11 does not have the molding structure 1050 but further includes bumps 1111 and bumps 1112. The bumps 1111 are disposed and coupled between the hard block 111 and the redistribution layer 922. The bumps 1112 are disposed and coupled between the latch-up protection circuit 121 and the redistribution layer 922.

In some embodiments, the redistribution layer 922 is further configured to transmit a signal input to the hard block 111 from the substrate 140, and a signal output from the hard block 111 to the substrate 140. For example, a signal from the substrate 140 is transmitted sequentially through the bumps 913, the redistribution layer 922 and the bumps 1111 to the hard block 111. Similarly, a signal output from the hard block 111 is transmitted sequentially through the bumps 1111, the redistribution layer 922, and the bumps 913 to the substrate 140.

In some embodiments, the redistribution layer 922 is further configured to transmit a signal input to the hard block 111 from the chip 130, and a signal output from the hard block 111 to the chip 130. For example, a signal from the chip 130 is transmitted sequentially through the bump 918, the conductive structure 932, the bump 917, the redistribution layer 922 and the bumps 1111 to the hard block 111. Similarly, a signal output from the hard block 111 is transmitted sequentially through the bumps 1111, the redistribution layer 921, the bump 917, the conductive structure 932 and the bump 918 to the chip 130.

Reference is now made to FIG. 12. FIG. 12 depicts a flow chart of a method 1200 for manufacturing a semiconductor device. At least some operations (or steps) in the method 1200 can be utilized to manufacture semiconductor devices, for example, semiconductor devices 100-300, 500-700, 900-1100 in FIGS. 1-11.

The method 1200 is merely an example and is not intended to limit the present disclosure. It is understood that additional operations can be provided before, during, and after the processes shown by FIG. 12, and some of the operations described below can be redisposed or eliminated, for additional embodiments of the method. The order of the operations/processes may be interchangeable. The method 1200 includes operations 1210, 1220, 1230, 1240 and 1250 which would be discussed below.

In the operation 1210, the latch-up protection circuit 121 is formed in the chip 120 as depicted in FIG. 2.

In the operation 1220, the redistribution layer 221 is formed at a side of the latch-up protection circuit 121, in which the latch-up protection circuit 121 is coupled to the chip 130 through the redistribution layer 221.

In the operation 1230, the hard block 111 is formed in the chip 110.

In the operation 1240, the redistribution layer 223 is formed at a side of the hard block 111, in which the hard block 111 is coupled to the latch-up protection circuit 121 through the redistribution layer 223.

In some embodiments, the method 1200 further includes forming the interposer 240 surrounding the latch-up protection circuit 121, and forming the via 230 configured to couple the redistribution layer 222 to the substrate 140, as depicted in FIG. 5.

In some embodiments, the method 1200 further includes forming the via 731 that is in the substrate 140 and configured to couple the redistribution layer 721 to the redistribution layer 722, in which the latch-up protection circuit 121 and the redistribution layer 721 are in the substrate 140, as depicted in FIG. 7.

In some embodiments, the method 1200 further includes forming the redistribution layer 922c configured to couple the redistribution layer 922a coupled to the hard block 111 to the redistribution layer 922b coupled to the latch-up protection circuit 121. In other embodiments, the redistribution layers are formed simultaneously as the redistribution layer 922 and packaged with the chips 110-120, as depicted in FIG. 10.

In some embodiments, the method 1200 further includes forming the molding structure 1050 that is on the redistribution layers 922a-922c and covers the hard block 111 and the latch-up protection circuit 121.

In the operation 1250, the molding structure 250 is formed to surround the chips 110, 120 and 130. In other words, the hard block 111, the redistribution layer 223, the latch-up protection circuit 121 and the chip 130 are included in the molding structure 250.

In some embodiments, the molding structure 1050 is formed in the molding structure 950.

In summary, the present disclosure provides a semiconductor device and a method of manufacturing the same. With the hard block and the latch-up protection circuit disposed in separated chips, heterogeneous integration is achieved. That is, a process with larger node than the process node for manufacturing the hard block could be used to manufacture the chip including the latch-up protection circuit to reduce the overall manufacturing cost.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a first chip disposed on the substrate;
a latch-up protection circuit separated from the first chip in a first direction;
a first redistribution layer configured to transmit a first signal between the latch-up protection circuit and the first chip; and
a second redistribution layer that is disposed under the first chip, electrically coupled to the first chip and separated from the first redistribution layer in the first direction,
wherein the second redistribution layer is configured to input the first signal to the first chip or receive the first signal from the first chip.

2. The semiconductor device of claim 1, wherein the first direction is a horizontal direction, and the first redistribution layer is under the latch-up protection circuit and electrically coupled to the second redistribution layer through the substrate.

3. The semiconductor device of claim 1, further comprising:
a second chip that is disposed on a surface of the substrate on which the first chip is disposed and electrically coupled to the first redistribution layer through the substrate.

4. The semiconductor device of claim 3, wherein the latch-up protection circuit is disposed in the substrate, and the substrate further comprises:
a first via configured to electrically couple the second chip to the first redistribution layer; and
a second via configured to electrically couple the first redistribution layer to the second redistribution layer.

5. The semiconductor device of claim 1, further comprising:
an interposer disposed on the substrate, wherein the latch-up protection circuit is included in the interposer and the first chip is disposed on a surface above the interposer;
a third redistribution layer disposed at a first side of the interposer and electrically coupled to the substrate, wherein the first redistribution layer is disposed at a second side, opposite to the first side, of the interposer; and
a first via that is disposed in the interposer and configured to electrically couple the first redistribution layer to the third redistribution layer.

6. The semiconductor device of claim 5, further comprising:
a second chip disposed on the surface above the interposer and electrically coupled to the first redistribution layer.

7. The semiconductor device of claim 1, further comprising:
a via that is disposed between the substrate and the first redistribution layer and configured to receive a second signal from the substrate as the first signal which is transmitted to the latch-up protection circuit through the first redistribution layer,
wherein the latch-up protection circuit comprises:
a first transistor having a first doped region, a second doped region and a first gate, wherein the first doped region is electrically coupled to the via through a terminal of the first redistribution layer, and the second doped region and the first gate are electrically coupled to a first voltage supply terminal; and
a second transistor having a third doped region, a fourth doped region and a second gate, wherein the third doped region is electrically coupled to the via through the terminal of the first redistribution layer, and the fourth doped region and the second gate are electrically coupled to a second voltage supply terminal.

8. A semiconductor device, comprising:
a substrate;
a first chip disposed on the substrate;
a latch-up protection circuit separated from the first chip;
a first redistribution layer configured to transmit a first signal between the latch-up protection circuit and the first chip; and
a second chip that is disposed on a surface of the substrate on which the first chip is disposed, wherein the second chip is electrically coupled to the first redistribution layer through the substrate.

9. The semiconductor device of claim 8, wherein the substrate comprises:

a first conductive structure configured to couple the second chip to the latch-up protection circuit.

10. The semiconductor device of claim 9, wherein the substrate further comprises:

a second conductive structure configured to transmit a signal between the latch-up protection circuit and the first chip.

11. The semiconductor device of claim 9, further comprising:

an interconnect structure, comprising:

an interposer surrounding the latch-up protection circuit.

12. The semiconductor device of claim 11, wherein the first chip is disposed on the interconnect structure and the interconnect structure is disposed on the substrate, wherein the semiconductor device further comprises:

a third chip disposed on the interconnect structure and coupled to the substrate through the interconnect structure.

13. The semiconductor device of claim 8, further comprising:

an interconnect structure configured to transmit a signal between the first chip and the substrate, the latch-up protection circuit being included in the interconnect structure; and a third chip disposed on a surface of the interconnect structure with the first chip disposed on the surface of the interconnect structure as well, and coupled to the first chip through the interconnect structure, wherein the second chip and the interconnect structure are disposed on the surface of the substrate, wherein the first chip and the third chip are configured to execute a first processing operation with a first processing speed, and the first chip and the second chip are configured to execute a second processing operation with a second processing speed slower than the first processing speed.

14. The semiconductor device of claim 8, further comprising:

an interconnect structure disposed in the substrate and configured to transmit a signal to the latch-up protection circuit, wherein in a top view, the interconnect structure overlaps the first chip and the second chip.

* * * * *